United States Patent
Sajan et al.

(10) Patent No.: US 6,355,399 B1
(45) Date of Patent: Mar. 12, 2002

(54) ONE STEP DUAL DAMASCENE PATTERNING BY GRAY TONE MASK

(75) Inventors: Marokkey Raphael Sajan; Zhu Sui Hua; Tsun-Lung Alex Cheng, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/483,930

(22) Filed: Jan. 18, 2000

(51) Int. Cl.$^7$ .................................................. G03C 5/00
(52) U.S. Cl. ............................ 430/311; 430/313; 430/5
(58) Field of Search ................................ 430/311, 313, 430/5

(56) References Cited

U.S. PATENT DOCUMENTS

| | | | |
|---|---|---|---|
| 5,480,047 A | * 1/1996 | Tanigawa et al. | 216/12 |
| 5,480,764 A | * 1/1996 | Gal et al. | 430/321 |
| 5,543,253 A | 8/1996 | Park et al. | 439/5 |
| 5,753,417 A | 5/1998 | Ulrich | 430/312 |
| 5,821,169 A | 10/1998 | Nguyen et al. | 438/736 |
| 5,830,605 A | * 11/1998 | Umeki et al. | 430/5 |
| 5,869,395 A | 2/1999 | Yim | 438/637 |
| 5,877,075 A | 3/1999 | Dai et al. | 438/597 |
| 5,906,910 A | * 5/1999 | Nguyen et al. | 430/311 |
| 6,033,766 A | * 3/2000 | Block et al. | 428/210 |
| 6,043,164 A | * 3/2000 | Nguyen et al. | 438/736 |
| 6,218,082 B1 | * 4/2001 | Yang | 430/325 |

OTHER PUBLICATIONS

Pierre Sixt, "Phase Masks and Grey–Tone Masks", Semi-–Conductor Fabtech, Switzerland, pp. 209–213.

Oppliger et al., "One–Step 3D Shaping Using a Gray–Tone Mask for Optical and Microelectronic Applications", Microelectronic Engineering 23 (1994), pp. 449–454.

* cited by examiner

*Primary Examiner*—Janet Baxter
*Assistant Examiner*—Amanda C. Walke
(74) *Attorney, Agent, or Firm*—George O. Saile; Rosemary L. S. Pike

(57) ABSTRACT

A new method is provided for the creation of a dual damascene structure. The method of the invention uses a gray tone mask to form dual damascene trenches in one single masking and etch step. The gray tone mask technology allows for a photoresist patterning process after which the photoresist profile can be transferred into the underlying substrate by an etch process. By making the photoresist profile equal to the profile of a dual damascene structure, the dual damascene profile can be created in the surface of a substrate.

10 Claims, 4 Drawing Sheets

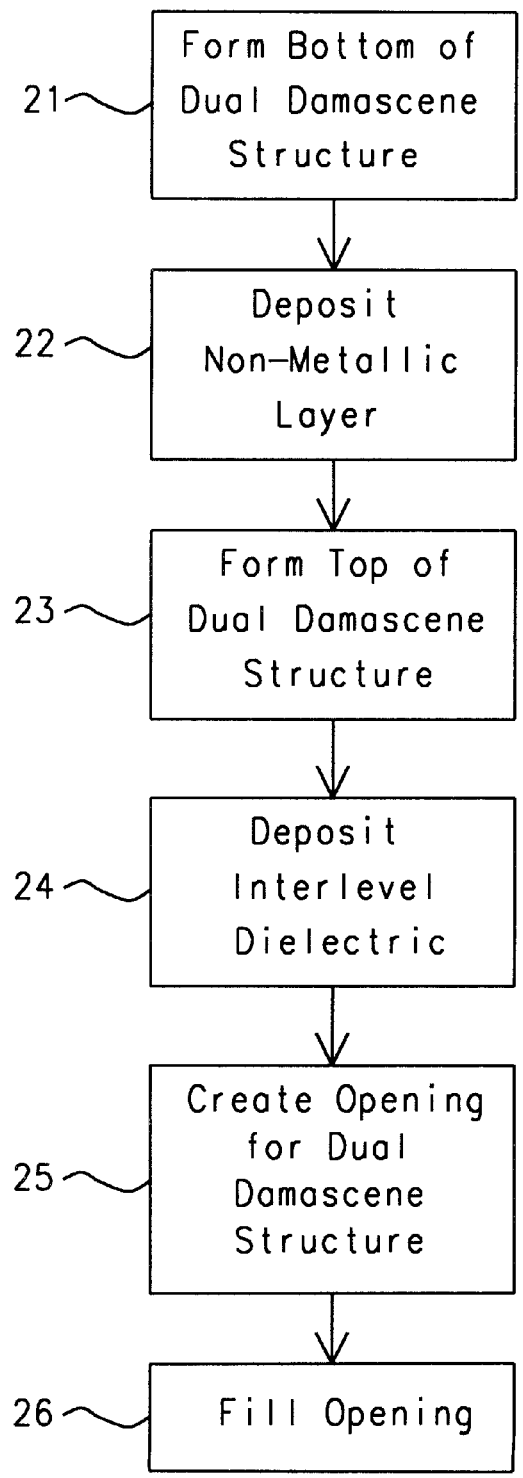
FIG. 1a – Prior Art

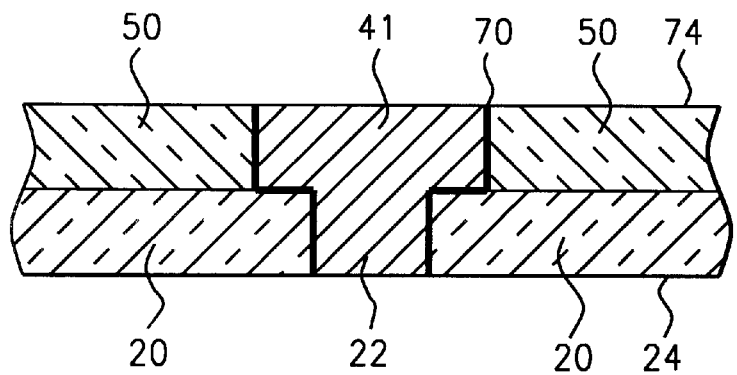
FIG. 1b — Prior Art
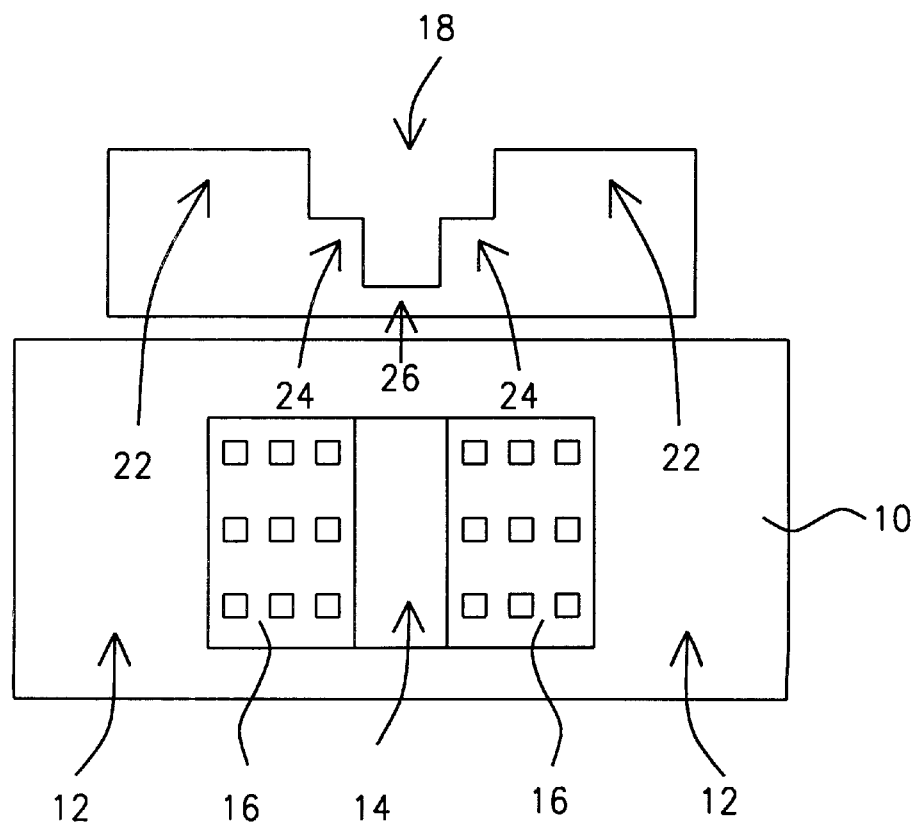
FIG. 2a

ONE STEP DUAL DAMASCENE PATTERNING BY GRAY TONE MASK

BACKGROUND OF THE INVENTION (1) Field of the Invention

The invention relates to the fabrication of integrated circuit devices, and more particularly, to a method of creating a dual damascene structure using one processing step of patterning this structure.

(2) Description of the Prior Art

The manufacturing of semiconductor devices requires the application of multiple diverse technical disciplines that collectively enable the continuing advancements of device performance that has been accomplished ever since the initiation of the semiconductor device. These various disciplines address various aspects of the device creation whereby typically a plurality of active circuits is created in a semiconductor substrate. To create a collection of circuits, commonly referred to as Integrated Circuits (IC's), the individual circuits are interconnected with metal leads. To further increase device density, multiple layers of interconnect metal can be created. These multiple layers of interconnect metal are separated by layers of dielectric or by insulating layers. Adjacent layers of metal lines are interconnected by means of metal contact plugs or vias.

The semiconductor industry has, over the last several decades, been driven by a continued striving to improve device performance, which requires a continued decrease of semiconductor device feature size. In present day semiconductor devices, it is not uncommon to encounter feature size in the deep sub-micron range. With this decrease in device feature size, sub-micron metal interconnects become increasingly more important. A number of different approaches are used in the art for the formation of patterns of interconnect lines, most of these approaches start with the deposition of a patterned layer of dielectric where the pattern in the dielectric forms contact openings between overlying metal and underlying points of electrical contact. A layer of metal is deposited over the layer of dielectric and patterned in accordance with the required pattern of interconnect lines whereby the interconnect lines, where required, align with the underlying contact openings. The patterning of the layer of metal requires the deposition of a layer of photoresist over the layer of metal, the photoresist is exposed typically using photolithographic techniques and etched, typically using a dry etch process. The patterned layer of photoresist is removed after the interconnect metal line pattern has been created leaving the interconnect line pattern in place. For sub-micron metal line sizes, these highlighted processing steps encounter a number of problems that are typical of device sub-miniaturization. These problems are problems of poor step coverage of the deposited metal (the metal should be evenly deposited and should fill the profile for the metal line with equal metal density), problems of etching (using dry etching but metal such as copper and gold are difficult to plasma etch) and problems of step coverage and planarization for the overlying layer of dielectric.

In the formation of semiconductor integrated circuits, it is common practice to form interconnect metal line structures on a number of different levels within the structure and interconnecting the various levels of wiring with contact or via openings. The first or lowest level of interconnect wires is typically formed as a first step in the process after which a second or overlying level of interconnect wires is deposited over the first level. The first level of interconnect wires is typically in contact with active regions in a semiconductor substrate but is not limited to such contacts. The first level of interconnect can for instance also be in contact with a conductor that leads to other devices that form part of a larger, multi-chip structure. The two levels of metal wires are connected by openings between the two layers, these openings are filled with metal whereby the openings between the two metal layers are lined up with and match contact points in one or both of the levels of metal lines.

The brief description of the process of metalization that has been given above has been described with reference to the damascene and dual damascene processes which form two widely used approaches in creating metal interconnects. The application of the damascene process continues to gain wider acceptance, most notably in the process of copper metalization due to the difficulty of copper dry etch where the damascene plug penetrates deep in very small, sub-half micron, Ultra Large Scale Integrated (ULSI) devices. Recent applications have successfully used copper as a conducting metal line, most notably in the construct of CMOS 6-layer copper metal devices.

With increasing device densities, the area that is available for circuit wiring becomes relatively more important as a potential limiting factor in device performance. This has led to the development of multi-layer wiring where the dual damascene structure has found wide use.

For the creation of the single damascene structure, vias only are created. For the creation of the dual damascene, vias are created and conductors are created above the vias. For the dual damascene, special etch procedures can be used to form both the vias and the conductor patterns in the dielectric layer before the deposition of metal and the metal CMP. A thin etch stop layer can be used for this purpose between two layers of dielectric $SiO_2$.

With the damascene process a metal via plug is first formed in a surface, typically the surface of a semiconductor substrate. A layer of dielectric (for instance $SiO_2$) is deposited over the surface (using for instance PECVD technology); trenches (for metal lines) are formed in the dielectric (using for instance RIE technology). Metal is deposited to fill the trenches; the excess metal on the surface is removed. A planar structure of interconnect lines with metal inlays in the (intra-level) dielectric is achieved in this manner.

For the dual damascene process, the processing steps can follow three approaches.

Approach 1, the via is created first. The vias are formed by resist patterning after which an etch through the triple layer dielectric stack is performed. This is followed by patterning the conductor in the top layer of $SiO_2$ thereby using the SiN as an etch stop layer.

Approach 2. The conductor first process. The conductor patterns is formed by resist patterning and by etching the conductor patterns into the first $SiO_2$ layer thereby using the SiN layer as an etch stop layer. This is followed by via resist patterning and etching through the thin layer of SIN and the second $SiO_2$ layer.

Approach 3. Etch stop layer first. The first $SiO_2$ layer is deposited, followed by the thin layer of SiN as etch stop, followed by the via resist patterning and etching of the SiN layer. This is followed by depositing the top $SiO_2$ layer and then the conductor patterning. In etching the conductor pattern in the top $SiO_2$ layer, the etching process will be stopped by the SiN layer except where the via holes are already opened in the SiN layer thereby completing the via holes etching in the first $SiO_2$ layer simultaneously.

FIGS. 1a and 1b further detail the above.

FIG. 1a gives and overview of the sequence of steps required of forming a Prior Art dual Damascene structure. The numbers referred to in the following description of the formation of the dual Damascene structure relate to the cross section of the completed dual Damascene structure that is shown in FIG. 1b.

FIG. 1a, 21 shows the creation of the bottom part of the dual Damascene structure by forming a via pattern 22 on a surface 24, this surface 24 can be a semiconductor wafer but is not limited to such. The via pattern 22 is created in the plane of a dielectric layer 20 and forms the lower part of the dual Damascene structure. SiO$_2$ can be used for this dielectric.

FIG. 1a, 22 shows the deposition within plane 30 (FIG. 1b) of a layer of non-metallic material such as poly-silicon on top of the first dielectric 20 and across the vias 22, filling the via openings 22.

FIG. 1a, 23 shows the formation of the top section 41 of the dual Damascene structure by forming a pattern 41 within the plane of the non-metallic layer 30. This pattern 41 mates with the pattern of the previously formed vias 22 (FIG. 1a, 21) but it will be noted that the cross section of the pattern openings 41 within the plane 30 of the non-metallic layer is considerably larger than the cross section of the via openings 22 (FIG. 1a, 21). After pattern 41 has been created and as part of this pattern creation step, the remainder of the non-metallic layer 30 is removed, the pattern 41 remains at this time.

FIG. 1a, 24 shows the deposition and planarization (down to the top surface of pattern 41) of an intra level dielectric (ILD) 50, a poly-silicon can be used for this dielectric.

FIG. 1a, 25 shows the creation of an opening by removing the poly-silicon from the pattern 41 and the vias 22. It is apparent that this opening now has the shape of a T and that the sidewalls of the opening are not straight but show a top section that is larger than the bottom section.

FIG. 1a, 26 shows the cross-section of the dual damascene structure where a barrier 70 has been formed on the sides of the created opening. The opening, which has previously been created by removing the poly-silicon from the pattern 41 and the vias 22, has been filled with a metal. Metal such as tungsten or copper can be used for this latter processing step.

The dual damascene process is being implemented as a standard back-end-of-line (BEOL) process in many manufacturing processes. The typical process involves two masking steps and is achieved using different approaches. In the first approach, a wire mask/etch is performed first while a via mask/etch is performed second. The second approach employs a via mask/etch first while a wire mask/etch is applied second. After patterning the via/wire profile, metal wires are defined using a CMP process. The second approach (via first, wire second) has the advantage of performing the (difficult) step of via masking over a planar dielectric surface. The disadvantages of the present dual damascene process that has been highlighted above are:

the process is a two step process that is expensive and time consuming the process is prone to misalignment between the wire profile and the via plug the removal of resist and etch residue from deep trenches in the substrate during the second masking and development sequence may become difficult for devices of significantly reduced device dimensions.

It is therefore desirable to provide a process of creating dual damascene structures that is not prone to the above indicated problems or potential problems. The invention provides such a process by making this process a one step process whereby no misalignment (between via plug and the wire profile) occurs and where no deep trenches are formed in the substrate.

U.S. Pat. No. 5,821,169 (Nguyen et al.) show a dual damascene process using a multi-level resist profile exposed using 2 optical masks. This patent is extremely close to the invention. This novel patent describes a method that is used to transfer a photoresist step profile to an underlying substrate. The invention concentrates on problems of the etch process that transfers the step profile.

U.S. Pat. No. 5,753,417 (Ulrich) shows a one PR method for forming a Dual Damascene opening. Ulrich uses 2 optical masks to form the multi-level resist layer in contrasts to the invention's 1 optical mask. Ulrich cited a gray tone mask in the "Other references" section. Overall, this patent is very close to the invention. The invention uses a multiple exposure masking system for forming a multi-level resist profile. The invention also describes a double exposure method, that it is uses two masks that have different transmission values.

U.S. Pat. No. 5,535,253 (Park et al.) discloses a Dual damascene shaped photoresist layer 12 (See FIG. 1C) formed using the same optical mask as the invention. However, Park forms a T-shaped gate, not a DD opening.

U.S. Pat. No. 5,877,075 (Dai et al.) shows a dual damascene process using 1 photoresist layer. The dual damascene process of this invention uses a single photoresist process. The invention describes a double exposure technique that uses two masks.

U.S. Pat. No. 5,869,395 (Yim) shows a dual damascene process using photoresist layer.

SUMMARY OF THE INVENTION

The principle objective of the invention is to provide a one step process for the creation of a dual damascene structure.

Another objective of the invention is to avoid problems of pattern misalignment in creating a dual damascene structure.

Yet another objective of the invention is to prevent potential problems of residue removal from the surface of a substrate in which a dual damascene structure has been created by avoiding the need for deep trenches in the surface of the substrate for the creation of dual damascene structures.

A still further objective of the invention is to reduce the time that is required to form a dual damascene structure.

In accordance with the objectives of the invention a new method is provided for the creation of a dual damascene structure. The method of the invention uses a gray tone mask to form dual damascene trenches in one single masking and etch step. The gray tone mask technology allows for a photoresist patterning process after which the photoresist profile can be transferred into the underlying substrate by a plasma etch or ion milling process. By making the photoresist profile equal to the profile of a dual damascene structure, the dual damascene profile can be created in the surface of a substrate.

BRIEF DESCRIPTION OF THE DRAWINGS

FIG. 1a shows a schematic presentation of the processing steps that are required for the creation of a conventional dual damascene structure.

FIG. 1b shows a cross section of a conventional dual damascene structure.

FIG. 2a gives a top view of a gray tone mask with a particular pattern that is to be created in a layer of photoresist.

FIG. 3a shows a cross section of a gray tone mask with various degrees of light passing capabilities embedded therein.

FIG. 3b shows another cross-section of a gray tone mask with various degrees of light passing capabilities embedded therein.

FIG. 3c shows a cross section of a substrate on which a layer of photoresist has been deposited, the photoresist is being exposed via the gray tone mask of FIG. 3a.

FIG. 3d shows a cross section of the substrate and the thereover deposited layer of photoresist after the layer of photoresist has been developed.

FIG. 3e shows a cross section of the substrate after the profile of the photoresist has been transferred into the surface of the substrate.

DESCRIPTION OF THE PREFERRED EMBODIMENTS

Figure 2B:
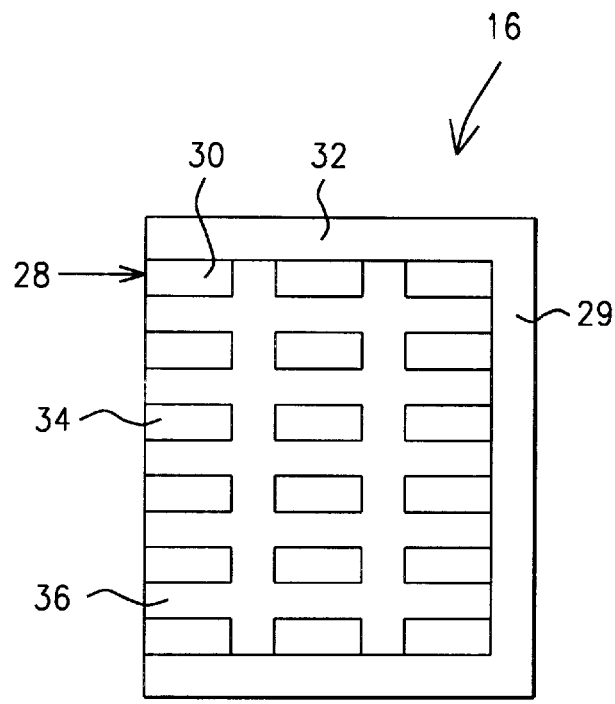
FIG. 2b gives a top view of a pattern of light passing and light blocking areas that is created in a gray tone mask.

The process of the invention specifically addresses problems that are typically encountered when using the conventional processes of creating three-dimensional structures as part of a semiconductor device. These problems are problems of anisotropic etching of silicon that is limited by the crystallographic orientation of the silicon substrate, the use of several masks for multiple etching procedures, alignment accuracy that limits deposition or growth steps of substrate layers and e-beam writing that is not cost effective for present day manufacturing environments.

The process of the invention makes use of gray-tome-masks (GTM's) that have been developed with the objective of creating three dimensional shapes using conventional semiconductor equipment and requiring only one step of exposure.

Using GTM's involves the steps of first creating the GTM itself, second the exposure of the wafer or other light sensitive areas by using the GTM as a medium through which the light passes before striking the target surface and finally the modulation of the light intensity by the gray-tome areas of the mask while the light passes through the mask. The gray tone area of the mask is the area through which the passage of light is modulated or controlled and where light transmission can vary from no light passing through the mask to all light passing through the mask. After the light sensitive surface, most typically containing positive or negative photoresist, has been exposed by light that has passed through the GTM, the exposed surface is developed thereby creating a three dimensional structure in this surface. This three-dimensional structure can then further be transferred into an underlying substrate.

Gray levels in a GTM can be created using one of two methods, that is the surface area of the openings through which the light passes can be varied whereby the distance between these areas remains the same (pulse-width modulation) or the surface area of the openings through which the light passes remains constant but the distance between these areas is varied (pulse density modulation). Of these two methods, the pulse-width method is the preferred method since it is easier to create the pattern for the openings in the GTM.

The number of differently graded exposures that can be made using the GTM is determined by such design parameters as the dimensions of the openings that are created in the mask and the pitch between the openings. The resolution of the light source that is used with the GTM also has a direct influence on the patterns that can be created using this approach. E-beam and laser beam pattern generators have been successfully used for this application whereby the e-beam pattern generator is the preferred tool due to its flexibility and resolution. Using this approach, it is not impossible to create up to eight different areas of gradated exposure. It is clear that these gradated areas of exposure of for instance a layer of photoresist will result, after development of the photoresist, in a three dimensional structure of significant complexity, a structure that can readily equal the structure of a conventional dual damascene profile. The structure that is in this manner created in the photoresist can be transferred to the underlying wafer or another underlying surface using plasma etching or ion milling technologies. Where the created profile has to be transferred to a silicon substrate, the etch can be performed using RIE reactor with fluorine based chemistry.

Referring now specifically to FIG. 2a, there is shown a top view of a gray tone mask that is typically used in other applications, most notably MEMS, where slanting profiles are created in a layer of photoresist and from there are transferred into an underlying substrate.

The abbreviation MEMS stands for Micro Electro Mechanical Systems and is part of a new technology of miniaturization, employing motors of extremely small size having a cross section of about 500 $\mu$m.

It is, as has already been stated, characteristic of the gray tone mark that incident light is transmitted through the mask in a graded or incremental manner. That is light can be completely transmitted (100% light transmission), it can be completely blocked (0% light transmission) or it can be transmitted a percentage that is between the 0% and the 100% light transmission. This is further illustrated in FIGS. 2a and 2b.

FIG. 2a shows a top view of a mask 10, in the mask a pattern has been created that allows for the above-indicated graded light transmission. The surface 12 of the mask 10 is a surface where no light will pass through the mask 10 making this a surface of 0% light transmission. Surface 14 of the mask 10 is a surface where all the light will pass through the mask making this a surface of 100% light transmission. Surface 16 of the mask 10 is a surface where the light that passes through the mask is graded between 0% and 100% light transmission. The amount of light that is required to pass through the surface area 16 is dependent on the photoresist that is being exposed by the light that passes through this area of the mask. Also shown in FIG. 2a is a profile 18, this is the profile that needs to be created in a layer 20 of photoresist. The different elevations of the profile 18 in the photoresist are related to the various surface areas of the mask 10 through which the light (that strikes the layer of photoresist) passes. It is clear that the light 22 is completely blocked by the gray mask 10 and will therefore transmit no energy to the surface of the layer 20 of photoresist. The etch of the layer of photoresist 20 will therefore not remove any of the photoresist in the area resulting in an unmodified profile in that part of the layer 20 of photoresist. The light 24 that passes through the gray tone area 16 will partially penetrate the mask and will strike the surface of the layer 20 of photoresist resulting in (some of) the photoresist being removed during photoresist development process. Even more light will pass through the surface area 14 of the mask resulting in a higher light energy striking the surface of the layer 20 of photoresist resulting in even more photoresist being removed from the layer 20 of photoresist during the etch of the layer 20 of photoresist. It is clear that the gradation in the light passing capability of the mask results in the profile 18 in the surface of the layer 20 of photoresist that is shown in FIG. 2a.

The grading or modulation of the light that impacts the surface of the layer of photoresist can be achieved by either pulse width or by pulse density schemes. This is further highlighted in the example shown in FIG. 2b.

FIG. 2b shows and example of the gray tone area (area 16, FIG. 2a) of a mask that can be used for creating a particular profile such as profile 18 that has previously been shown under FIG. 2a. The white or clear regions 32 of the mask provide 100% transmission of the incident light, the chrome or black regions 30 of the mask block all incident light. Region 28 is an area where the chrome region 30 of the mask overlaps the white area (14, FIG. 2a) and where therefore no white frame is required immediately adjacent and to the left of the area 28. On the other side of the gray tone area of the mask, that is area 29, the outer clear or white area overlaps with the dark area (12, FIG. 2a) of the mask. The essence of the top view of the gray tone area 16 of the mask provides the following insights:

- by changing the ratio of black versus white areas, the amount of light that passes through the mask can be changed
- by changing the surface area of the mask through which the light can pass (pulse width), the energy that is transmitted to the surface that is exposed can be changed
- by changing the pitch of the areas through which light can pass (pulse-density modulation), the energy that is transmitted to the surface that is exposed can be changed.

A sharp profile can be maintained using this kind of a mask because area 29 in FIG. 2b is more translucent than all the other areas. This is instrumental in helping to define the edge of the profile, fine tuning of the photoresist process is required to define a sharp cut-off.

In region 29, the width of the light is adjusted to be equal to or less than ⅓ of the incident wavelength since in this region the outer white frame overlaps with the dark area of the mask of FIG. 2a. All the areas of the black strips 34 of mask 32 have the same area surface size. The design of the mask requires that the white pattern area 36 be calculated so as to have the width of the black areas 34 equal to or less than the incident wavelength/3. In the case where DUV light is used for the incident light, with a wavelength of 248 nm, the black areas 34 must be equal to or less than 80 nm. Depending on the design rule (dimensions) of the required damascene structure, the width of the white region 36 and the black regions 34 may have to be reduced until the length equals about the wavelength divided by 6.

Figure 3A:
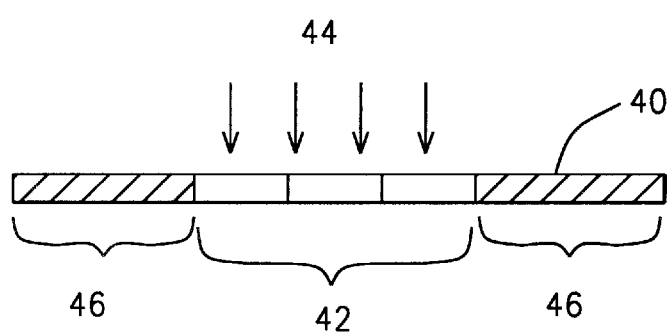
FIGS. 3a through 3e show cross sections of the application of a gray tone mask in a semiconductor environment, as follows.

Referring now specifically to FIG. 3a, there is shown a cross section of a gray tone mask 40. In areas 46 of the mask 40 no light will be transmitted through the mask 40. In the area 42 the light that can pass through the mask can be graded from very low amounts of light to complete or 100% of the light being passed through the mask. This is further highlighted under FIG. 3b. The incident light that is aimed at the mask 40 has been highlighted as 44.

Figure 3B:
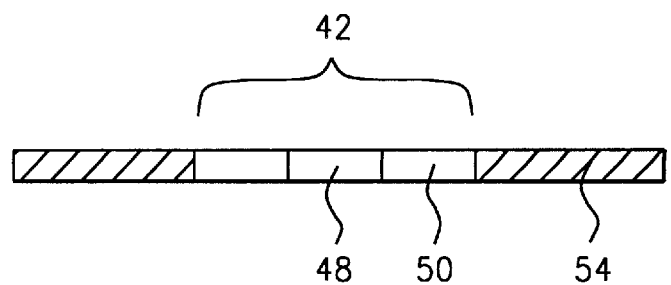

The cross section that is shown in FIG. 3b shows the various percentages of incident light that can pass through the mask 40, as follows:

for area 48, 100% of the incident light passes through the mask for area 50, 50% of the incident light passes through the mask for area 54, 0% of the incident light passes through the mask.

Figure 3C:
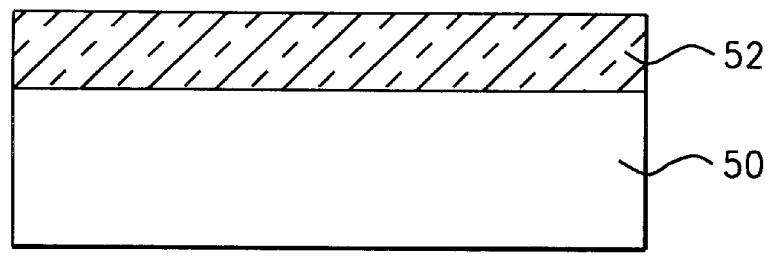

FIG. 3c shows a cross section of a substrate 50 over which a layer 52 of photoresist has been deposited. This layer of photoresist is the target of the light that passes through the gray tone mask 40 of FIG. 3a. The methods of depositing this layer 52 of photoresist are well known and understood in the art and will therefore not be further detailed at this time. The thickness of the layer of photoresist is of importance in that this thickness has a direct impact on the to be created dual damascene structure in the substrate 50. The cross section of the dual damascene structure that is created in the substrate 50 will be essentially identical to the cross section of the profile that is created in the layer 52 of photoresist. The dimensions of the profile that is created in the photoresist 52 must therefore be established such that the desired dual damascene structure can be created in the substrate 50. The thickness of the layer of photoresist must therefore be able to accommodate the depth of the dual damascene structure that is to be created.

Figure 3D:
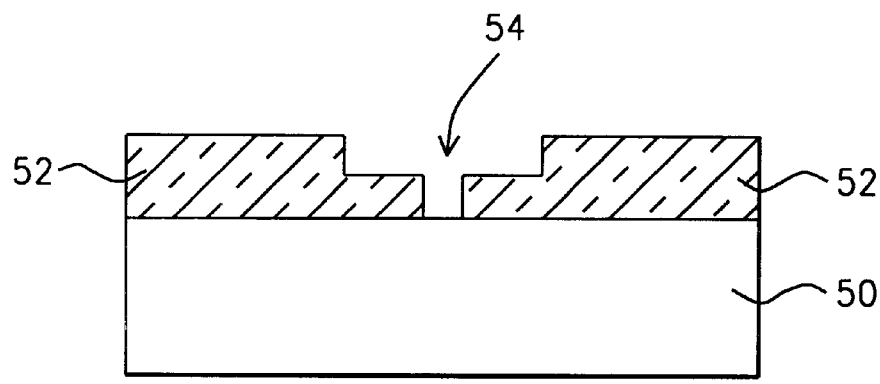

FIG. 3d shows a cross section of the dual damascene profile that has been created in the layer 52 of photoresist. The photoresist can, after the exposure of the photoresist has been completed, be removed using conventional methods of ashing in an $O_2$ plasma followed by washing off the undeveloped photoresist by a native oxide dip for 90 sec. in a 200:1 dilute solution of hydrofluoric acid. This process can, if desired, be followed by plasma etching to clean out the areas where the photoresist has been washed away. The photoresist that is used is rendered soluble by the light exposure (positive working) and forms the pattern 54 of the dual damascene structure that is shown in FIG. 3d.

Frequently used photoresist stripping agents contain sulfuric acid ($H_2SO_4$) or mixtures of $H_2SO_4$ with other oxidizing agents such as for instance hydrogen peroxide ($H_2O_2$). A frequently used mixture is seven parts $H_2SO_4$ to three parts of 30% $H_2O_2$ or a mixture of 88% sulfuric acid and 12% nitric acid. Wafers to be stripped can be immersed in the indicated mixture at a temperature between about 100 degrees C. and 150 degrees C. for between about 5 and 10 minutes after which they are subjected to a thorough cleaning with DI water and dried using dry nitrogen. Inorganic resist strippers, such as the sulfuric acid mixtures, are very effective in residual-free removal of highly postbaked resist. They are more effective than organic stripping agents while an extended immersion time results in a cleaner and more residue-free wafer surface.

Figure 3E:
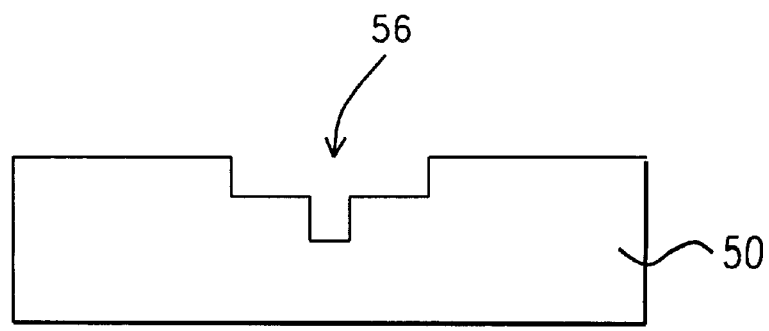

FIG. 3e shows the dual damascene structure after the profile 54 (FIG. 3d) has been transferred to the surface of the substrate 50 and forms the pattern 56 of the dual damascene structure in the surface of the substrate 50. This transfer of profile 54 in the layer of photoresist into the surface of the substrate 50 where it forms profile 56 can be achieved by plasma etching or by ion milling.

It is clear from the cross section that is shown in FIG. 3e and from the above provided description of the processing steps that are required to create the dual damascene profile that is shown in FIG. 3e that the process of the invention meets that objectives of the invention, that is:

it provides a one step process for the creation of a dual damascene structure since only one mask is used for the creation of the dual damascene structure problems of pattern misalignment in creating a dual damascene structure have been avoided the need for deep trenches in the surface of the substrate for the creation of dual damascene structures has been eliminated, and the time that is required to form a dual damascene structure has been significantly reduced due to the simplified sequence of operations that is required to created the dual damascene structure.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a dual damascene pattern employing a single layer of photoresist, comprising the steps of:

providing a semiconductor substrate said substrate having a surface;

providing a light source;

providing a gray tone mask, said gray tone mask having gradation of light passing capability such that light passes through said mask in varying degrees, said degrees varying between 0% or no light passing to 100% or all light passing through said gray tone mask, whereby furthermore gradation of light passing capability of said gray tone mask being such that light that strikes an underlying layer of photoresist imparts energy to said layer of photoresist in a pattern across a surface of said layer of photoresist and with a variation in a level of energy imparted and distributed across said layer of photoresist such that a pattern of a dual damascene structure is created in said layer of photoresist after developing said layer of photoresist, said gradation of light passing capability of said gray tone mask being achieved by keeping surface areas of openings through which light can pass through said mask constant while varying pitch between said openings;

depositing a layer of photoresist over the surface of said substrate;

positioning said gray tone mask between said substrate and said source of light such that a plane of said gray tone mask is parallel to a plane of a surface of said layer of photoresist;

directing light provided by said light source to said layer of photoresist, said light passing through said gray tone mask before striking a surface of said layer of photoresist;

removing said gray tone mask;

developing said exposed layer of photoresist, removing exposed photoresist, creating a pattern in said layer of photoresist;

transferring said pattern in said layer of photoresist into the surface of said substrate; and removing said photoresist from the surface of said substrate.

2. The method of claim 1 wherein said depositing a layer of photoresist over the surface of said substrate is a process of spin coating and baking whereby said layer of photoresist is deposited to a thickness of between about 8000 and 20,000 Angstrom forming a layer of positive photoresist material.

3. The method of claim 1 wherein said light is, in combination with and dependent on light passing capabilities of said gray mask, modulated in either amplitude or frequency or phase or a combination thereof with as objective of adjusting intensity and pattern of light energy that is imparted to said layer of photoresist whereby said light furthermore strikes a surface of said photoresist layer under an angle of essentially 90 degrees.

4. The method of claim 3 wherein said light modulation is uniform across a surface of said gray mask.

5. The method of claim 3 wherein said light modulation is not uniform across a surface of said gray mask.

6. The method of claim 1 wherein said light source is an UV or a DUV light source.

7. The method of claim 1 wherein said transferring said pattern in said layer of photoresist into the surface of said substrate is a plasma etching or an ion milling process.

8. The method of claim 1 wherein said developing said exposed layer of photoresist is a process of ashing in an $O_2$ plasma followed by washing off undeveloped photoresist by a native oxide dip for 90 sec. in a 200:1 dilute solution of hydrofluoric acid.

9. The method of claim 8 with an additional processing step of plasma etching thereby cleaning out areas where photoresist has been washed away.

10. A method of forming a dual damascene pattern employing a single layer of photoresist, comprising the steps of:

providing a semiconductor substrate said substrate having a surface;

providing a gray tone mask, said gray tone mask having gradation of light passing capability such that light passes through said mask in varying degrees said degrees varying between 0% or no light passing to 100% or all light passing through said gray tone mask whereby furthermore a gradation of light passing capability of said gray tone mask is such that light that strikes an underlying layer of photoresist imparts electrical energy to said layer of photoresist in a pattern across a surface of said layer of photoresist and with a variation in level of energy imparted and distributed across said layer of photoresist such that a pattern of a dual damascene structure is created in said layer of photoresist after said layer of photoresist is developed, said gradation of light passing capability of said gray tone mask being achieved by keeping surface areas of openings through which light can pass through said mask constant while varying pitch between said openings;

providing a UV or DUV light source whereby said light source can provide un-modulated or amplitude or frequency or phase or a combination thereof modulated light in a uniform or none-uniform manner across a surface of said gray tone mask;

depositing a layer of photoresist over the surface of said substrate to a thickness of between about 8,000 and 20,000 Angstrom forming a layer of positive photoresist material;

positioning said gray tone mask between said substrate and said source of light such that a plane of said gray tone mask is parallel to a plane of a surface of said layer of photoresist;

directing light provided by said light source to said layer of photoresist, said light passing through said gray tone mask before striking a surface of said layer of photoresist, said light furthermore striking a surface of said photoresist layer under an angle of essentially 90 degrees;

removing said gray tone mask;

developing said exposed layer of photoresist, removing exposed photoresist, developing a pattern in said layer of photoresist;

transferring said pattern in said layer of photoresist into the surface of said substrate using plasma etching or an ion milling process; and removing said photoresist from the surface of said substrate.

\* \* \* \* \*